United States Patent [19]

Swann et al.

[11] Patent Number: 4,797,261

[45] Date of Patent: Jan. 10, 1989

[54] MULTIPLE SPECIMEN CRYOTRANSFER HOLDER FOR ELECTRON MICROSCOPES

[75] Inventors: Peter R. Swann, Diablo; Joseph S. Jones, Livermore, both of Calif.

[73] Assignee: Gatan Inc., Pleasanton, Calif.

[21] Appl. No.: 116,167

[22] Filed: Nov. 3, 1987

[51] Int. Cl.⁴ .................. G01N 21/01; B01L 11/00
[52] U.S. Cl. .................. 422/102; 250/442.1; 250/443.1; 422/65
[58] Field of Search .................. 422/65, 66, 101, 102; 436/63; 250/442.1, 443.1

[56] References Cited

U.S. PATENT DOCUMENTS

| | | | |
|---|---|---|---|
| 3,533,744 | 10/1970 | Unger | 436/63 |
| 3,858,049 | 12/1974 | Koch et al. | 250/442.1 |
| 3,958,124 | 5/1976 | Koch et al. | 250/442.1 |
| 4,227,080 | 10/1980 | Okura et al. | 250/442.1 |
| 4,349,510 | 9/1982 | Kolehmainen et al. | 422/66 |
| 4,647,431 | 3/1987 | Sekine et al. | 422/65 |
| 4,703,181 | 10/1987 | Swann et al. | 250/442.1 |

OTHER PUBLICATIONS

Hax et al., "A Cryo-Transfer System for a Transmission Microscope", Thirty-Eighth Annual EMSA Meeting; pp. 616–617.

*Primary Examiner*—Barry S. Richman
*Assistant Examiner*—Lyle Alfandary-Alexander

[57] ABSTRACT

An electron microscope cryotransfer holder capable of simultaneously transferring several specimens is described. A cryo-shield protects the specimens from warming or frosting during the transfer from the specimen-loading workstation into the microscope.

3 Claims, 1 Drawing Sheet

MULTIPLE SPECIMEN CRYOTRANSFER HOLDER FOR ELECTRON MICROSCOPES

BACKGROUND

1. Field of Invention

The invention relates to multiple specimen cryotransfer holders for electron microscopes and especially to side-entry holders for transmission electron microscopes.

2. Description of Prior Art

Traditional resin embedding methods are effective in preserving most of the fine microstructural detail of biological specimens when examined in the electron microscope. Unfortunately, however, cell chemistry is completely disrupted. For these and other reasons, there is growing interest in ultra-rapid freezing of specimens as a method for preparing biological specimens. While this approach has many advantages, there are technical problems to be overcome; not only must the specimen be frozen very rapidly to minimize damaging ice crystal growth but once frozen, the specimen must be kept cold (typically $\sim -180°$ C.) at all times.

Cryotransfer holders have been developed which keep the specimen cold and prevent frost forming on the specimen during the transfer of the holder from the specimen-loading workstation into the microscope. Typically, once the specimen has been loaded into the holder, a close-fitting cryo-shield, at a similar temperature to the specimen, is moved into position to completely cover the specimen during transfer. Once inside the microscope, the shield is retracted.

In a known cryotransfer holder manufactured by Gatan Inc., the inner wall of a dewar containing liquid nitrogen is connected to the tip of the specimen holder by a copper conductor. The copper conductor is mechanically supported by low conductivity bearings within a tube which connects the outer wall of the liquid nitrogen dewar to the holder tip. The space between the outer tube and the copper conductor is contiguous with the space between the inner and outer walls of the liquid nitrogen dewar and is evacuated to provide thermal insulation. The greater part of this surrounding tube is made from steel to provide mechanical strength while the part adjacent to the holder tip is made from plastic to provide thermal insulation. By this means, the whole tip of the holder is cooled, unlike other transmission electron microscope specimen cooling holders where only a small specimen cradle is cooled. Problems of insulation are thereby minimized since more than adequate thermal insulation is provided by the low conductivity silica rod in the holder tip which is the mechanical bearing to the transmission electron microscope stage. A thin rod sliding through the center of the copper conductor is used to move a close fitting cryoshield over the specimen.

A major problem in the observation of specimens inside the electron microscope at very low temperature is the build up of water ice on the specimen. This can be minimized by anticontaminators. However, most water vapor enters the microscope through the airlock with the specimen. Therefore, once the specimen is inside the microscope, it is usual to leave the protecting cryoshield in position for as long as one hour while the microscope pumping system and the microscope anticontaminator remove the residual water vapor.

Heretofore, cryotransfer holders have only been capable of transferring one specimen at a time. Clearly, if users wish to obtain the best results, the number of specimens that can be observed is severely limited by the lengthy waiting period required after loading the specimen into the microscope. Most users, therefore, would find a significant advantage in being able to simultaneously transfer several specimen into the microscope.

OBJECTS AND ADVANTAGES

Accordingly the following objects and advantages are claimed for the invention: to provide a cryotransfer holder for electron microscopes which permits the simultaneous transfer from the specimen-loading workstation into the microscope of several specimens while maintaining them at a low temperature and protecting them from frosting.

DRAWING FIGURES

DRAWING REFERENCE NUMERALS

Figure 1:
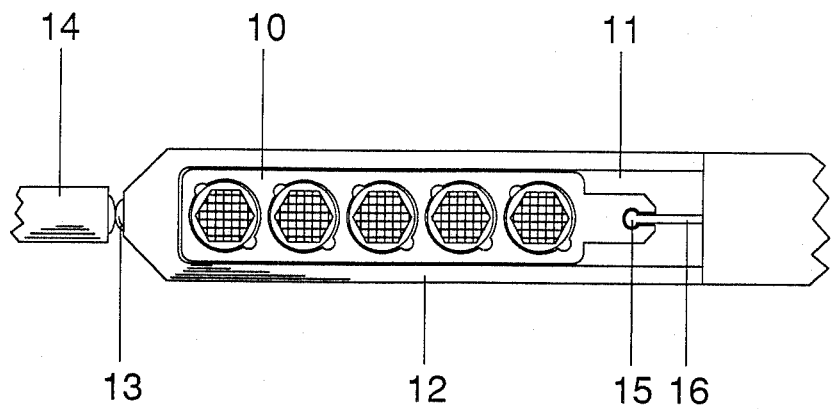
FIG. 1 shows the tip of the invention with the specimen cartridge completely moved out from beneath the cryoshield and in position for viewing the last specimen or removing the specimen cartridge.

10: specimen cartridge
11: recess
12: tip of cryotransfer holder
13: bearing
14: part of microscope stage
15: ball-and-socket coupling
16: rod
17: cryoshield
18: orifice

DESCRIPTION OF THE PREFERRED EMBODIMENT

With reference to FIG. 1, specimen cartridge 10 contains several frozen specimens held in position by, for example, threaded rings and seats within recess 11 in tip 12 of the cryotransfer holder. The complete tip 12 is cooled via a copper conductor by a liquid nitrogen dewar. Specimen cartridge 10 constructed from a rigid material of high thermal conductivity (e.g. copper) and in close contact with holder tip 12, is free to move within recess 11. Recess 11 extends back into the body of tip 12, forming cryoshield 17 inside which specimen cartridge 10 can sit. Bearing 13, constructed according to U.S. Pat. No. 4,703,181 herein incorporated by reference, bears against part of microscope stage 14 and insulates cooled tip 12 from the microscope. Ball-and-socket coupling 15 connects specimen cartridge 10 with rod 16 which leads along the length of the cryotransfer holder and out of the electron microscope to allow an operator to move specimen cartridge 10 while inside the vacuum of the microscope.

Figure 2:
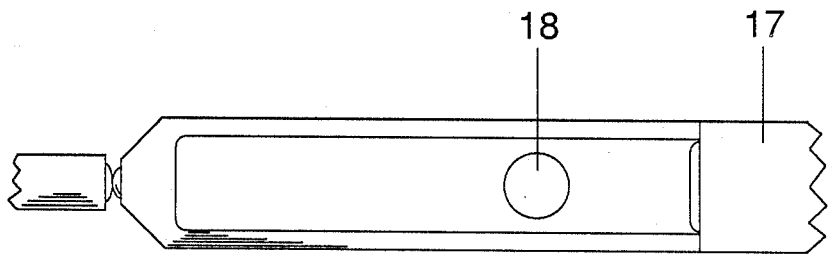
FIG. 2 shows the tip of the invention with the specimen cartridge completely withdrawn inside the cryoshield.

In FIG. 2 rod 16 is completely withdrawn, moving all of cartridge 10 inside cryo-shield 17, protecting the specimen from frosting during transfer. Once inside the microscope, specimens can be positioned over orifice 18 for observation by moving rod 16.

Figure 3:
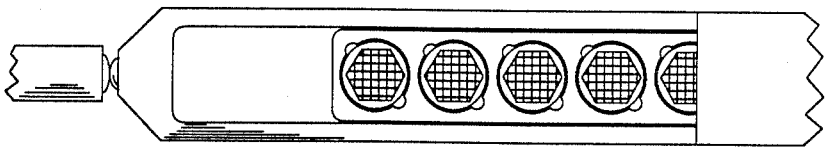
FIG. 3 shows the tip of the invention with the specimen cartridge partially moved out from beneath the cryoshield to view one of the specimens.

FIG. 3 illustrates the invention with specimen cartridge 10 positioned for observing the third specimen.

While the above description contains many specificities, the reader should not construe these as limitations on the scope of the invention but merely as exemplifications of the preferred embodiments thereof. Those skilled in the art will envisage other possible variations within its scope. For example, by splitting the cryoshield into two parts, one fixed and one movable, it would be possible to expose only the specimen actually under observation while protecting the remaining specimens.

What is claimed is:

1. A specimen cooling holder for a transmission electron microscope including:
    a cooling means for cooling the high thermal conductivity tip of said specimen cooling holder,
    a low thermal conductivity bearing between said tip and a transmission electron microscope stage,
    a recess within said tip, said recess being trough-shaped proximal to said low thermal conductivity conductivity bearing and being tube-shaped distal from said low thermal conductivity conductivity bearing,
    an opening interconnecting the two sections of said recess,
    a specimen cartridge dimensioned to fit closely within said recess and constructed from a material of high thermal conductivity,
    a plurality of holes passing completely through said specimen cartridge,
    securing means for securing specimens within said holes,
    and a translating means for moving said specimen cartridge within said recess such that said specimen cartridge can be withdrawn inside the tube-shaped portion of said recess or positioned at any point within said recess,
    whereby a plurality of specimens may be positioned in the tube-shaped part of said recess and thereby kept cold and shielded from frosting during transfer into said transmission electron microscope.

2. A device as claimed in claim 1 where said cooling means comprises a dewar of liquid nitrogen connected to said tip by a thermally insulated conductor.

3. A device as claimed in claim 1 where said translating means comprises a thin rod running along the length of said specimen cooling holder, one end being connected to said specimen cartridge and the other end being outside said transmission electron microscope and a sliding vacuum seal whereby the vacuum inside said transmission electron microscope is maintained and said specimen cartridge can be freely moved within said first recess during the operation of said transmission electron microscope.

* * * * *